(12) United States Patent
Vummintala et al.

(10) Patent No.: US 8,856,609 B2
(45) Date of Patent: Oct. 7, 2014

(54) ACCELERATED CYCLICAL REDUNDANCY CHECK

(75) Inventors: Shashidhar Vummintala, Bangalore (IN); Arumugam Velayoudame, Bangalore (IN); Gowrisankar Somichetty, Bangalore (IN); Sriram Rajagopal, Bangalore (IN); Sandip Solanki, Bangalore (IN); Kalyana Krishnan, Bangalore (IN)

(73) Assignee: Broadcom Corporation, Irvine, CA (US)

( * ) Notice: Subject to any disclaimer, the term of this patent is extended or adjusted under 35 U.S.C. 154(b) by 128 days.

(21) Appl. No.: 13/434,552

(22) Filed: Mar. 29, 2012

(65) Prior Publication Data

US 2013/0132796 A1   May 23, 2013

Related U.S. Application Data

(60) Provisional application No. 61/562,196, filed on Nov. 21, 2011, provisional application No. 61/570,571, filed on Dec. 14, 2011.

(51) Int. Cl.
| | | |
|---|---|---|
| H03M 13/00 | (2006.01) | |
| H03M 13/09 | (2006.01) | |
| H03M 13/29 | (2006.01) | |
| H04L 1/00 | (2006.01) | |
| H04L 1/18 | (2006.01) | |
| G06F 11/10 | (2006.01) | |
| H03M 13/15 | (2006.01) | |
| H03M 13/23 | (2006.01) | |

(52) U.S. Cl.
CPC ............. *H03M 13/091* (2013.01); *G06F 11/10* (2013.01); *H03M 13/09* (2013.01); *H03M 13/29* (2013.01); *H03M 13/1515* (2013.01); *H03M 13/23* (2013.01); *H03M 13/2906* (2013.01); *H03M 13/2957* (2013.01); *H03M 13/6306* (2013.01); *H04L 1/0045* (2013.01); *H04L 1/0052* (2013.01); *H04L 1/0061* (2013.01); *H04L 1/1809* (2013.01)
USPC ........................................... 714/757; 714/758

(58) Field of Classification Search
None
See application file for complete search history.

(56) References Cited

U.S. PATENT DOCUMENTS

| | | | | |
|---|---|---|---|---|
| 5,142,534 | A * | 8/1992 | Simpson et al. ............. | 370/330 |
| 6,628,667 | B1 * | 9/2003 | Murai et al. .................. | 370/468 |
| 6,747,992 | B1 * | 6/2004 | Matsumoto .................... | 370/468 |
| 6,798,826 | B1 * | 9/2004 | Shiu et al. ..................... | 375/147 |
| 6,920,602 | B1 * | 7/2005 | Park et al. ..................... | 714/788 |
| 6,944,348 | B2 * | 9/2005 | Kajita ........................... | 382/239 |
| 7,461,324 | B2 * | 12/2008 | Berkmann et al. ............ | 714/758 |
| 7,793,194 | B2 * | 9/2010 | Seo et al. ....................... | 714/776 |
| 7,853,857 | B2 * | 12/2010 | Buckley et al. ............... | 714/781 |
| 2007/0127524 | A1 * | 6/2007 | Matsumoto et al. .......... | 370/468 |
| 2009/0119568 | A1 * | 5/2009 | Shen et al. ..................... | 714/781 |
| 2011/0075753 | A1 * | 3/2011 | Jung et al. ..................... | 375/267 |
| 2011/0078539 | A1 * | 3/2011 | Kim et al. ..................... | 714/758 |

* cited by examiner

*Primary Examiner* — Daniel McMahon
(74) *Attorney, Agent, or Firm* — Sterne, Kessler, Goldstein & Fox P.L.L.C.

(57) ABSTRACT

Improved strategies for a Cyclical Redundancy Check (CRC) are disclosed. A CRC check of a codeblock may be initiated by a CRC decoder before receiving all of the bits by a corresponding FEC encoder. Furthermore, an incremental CRC check with respect to the data packet without the need for requesting passed through data from higher layers.

20 Claims, 7 Drawing Sheets

FIG. 1A

PRIOR ART

ACCELERATED CYCLICAL REDUNDANCY CHECK

CROSS-REFERENCE TO RELATED APPLICATIONS

This patent application claims the benefit of U.S. Provisional Patent Application No. 61/562,196, filed Nov. 21, 2011, and U.S. Provisional Patent Application No. 61/570,571, filed Dec. 14, 2011, each of which is incorporated herein by reference in its entirety.

BACKGROUND

1. Field of Disclosure

The disclosure relates generally to the field of communications in a transceiver, and more particularly to improved strategies for Cyclical Redundancy Check.

2. Related Art

Cyclic Redundancy Check (CRC) is a commonly used technique in digital communication networks for detecting errors in received data packets. Conventionally, a transmitter appends a certain number of check bits, often referred to as a checksum, to a sequence of data to form a data packet. Conventionally, the transmitter encodes the sequence of data, which may be represented as an information polynomial, by dividing the information polynomial by a CRC polynomial $C(D)$ to produce a quotient polynomial $Q(D)$ and a remainder $E(D)$. The conventional transmitter appends the remainder $E(D)$ as the check bits to the sequence of data to form the data packet for transmission to a conventional receiver.

The conventional receiver examines the data packet to determine whether an error occurred during its transmission. In conventional CRC, all of the bits of the data packet must be decoded before a determination can be made whether the error occurred during its transmission. Typically, the conventional receiver decodes the data packet starting from a most significant bit, typically an information bit, to the least significant bit, typically a check bit. Conventionally, this decoding involves dividing the data packet, which may be represented as a received polynomial $R(D)$, by the CRC polynomial $C(D)$ used by the conventional transmitter to produce a quotient polynomial $Q(D)$ and a remainder $E(D)$. The conventional receiver examines the remainder $E(D)$ to determine whether the error occurred during transmission of the data packet. When the remainder $E(D)$ is zero then no error occurred during transmission of the data packet. Otherwise, some error occurred during transmission of the data packet. However, decoding of each of the codeblocks in this manner can lead to latency, especially due to the possibly large size of packets.

BRIEF DESCRIPTION OF THE DRAWINGS/FIGURES

The accompanying drawings, which are incorporated herein and form a part of the specification, illustrate the present disclosure and, together with the description, further serve to explain the principles of the disclosure and to enable a person skilled in the pertinent art to make and use the disclosure.

DETAILED DESCRIPTION

In the following description, numerous specific details are set forth in order to provide a thorough understanding of the disclosure. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

The present disclosure will now be described with reference to the accompanying drawings. In the drawings, like reference numbers indicate identical or functionally similar elements. Additionally, the left-most digit(s) of a reference number identifies the drawing in which the reference number first appears.

Exemplary Communications System

Figure 1A:
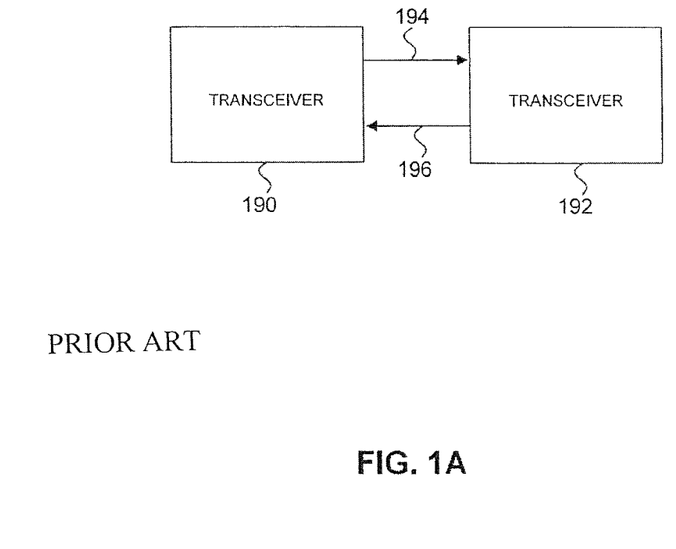
FIG. 1A illustrates a block diagram of a communications system according to an exemplary embodiment of the present disclosure.

FIG. 1A illustrates a block diagram of a communications system according to an exemplary embodiment of the present disclosure. A first transceiver 190 communicates with a second transceiver 192 over a communications channel. The communications channel may represent a wired communications channel such as a coaxial cable, fiber optic cable, or copper conductor to provide some examples, and/or a wireless communications channel. The first transceiver 190 includes a transmitter to provide a first transmitted communications signal 194 to the communications channel. The second transceiver 192 includes a receiver to observe the first transmitted communications signal 194 as it passes through the communications channel. The second transceiver 192 also includes a transmitter to provide a second transmitted communications signal 196 to the communications channel. The first transceiver 190 includes a receiver to observe the second transmitted communications signal 196 as it passes through the communications channel.

Exemplary Transceiver

Figure 1B:
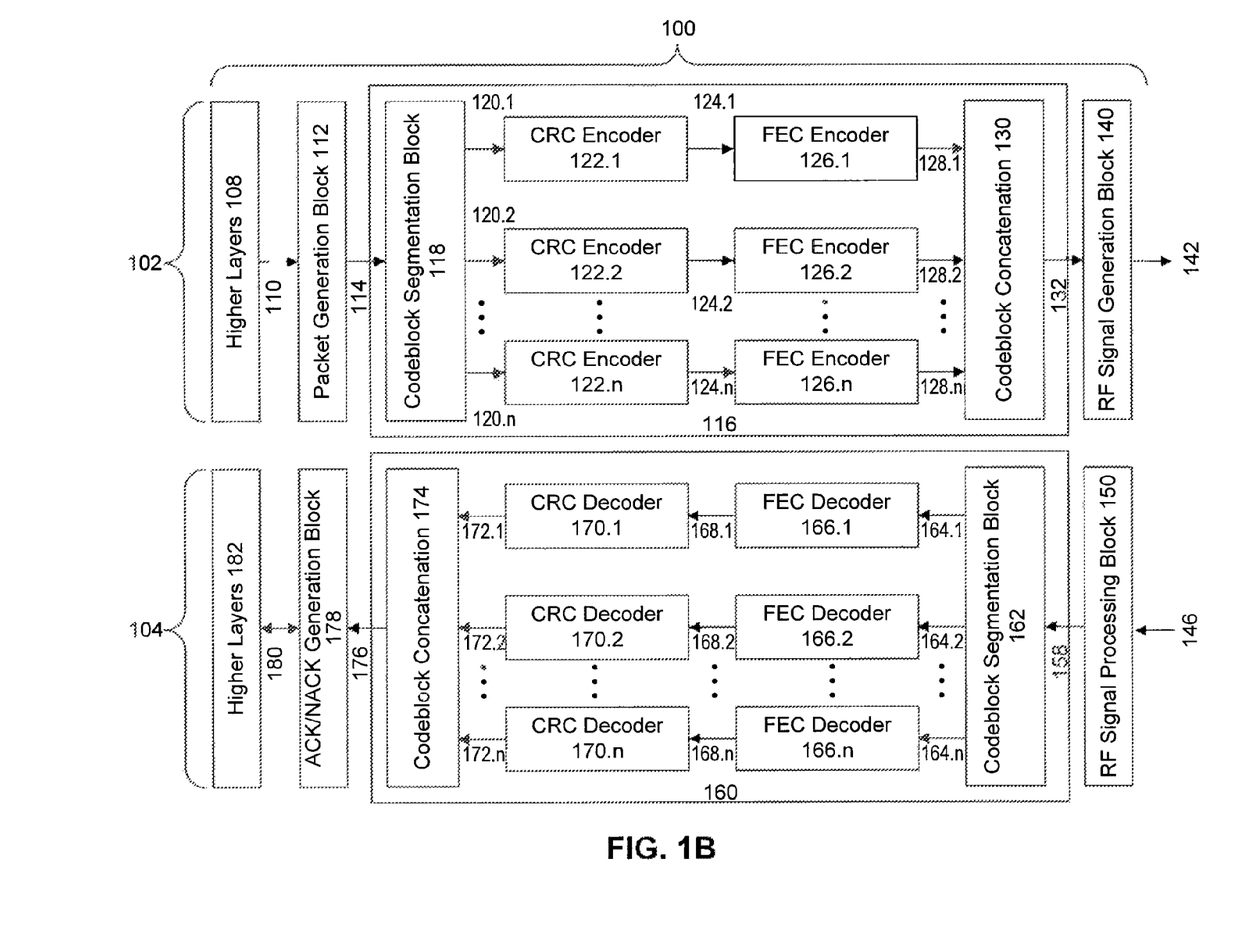
FIG. 1B illustrates a block diagram of an exemplary transceiver that may implemented as part of the communications system according to an exemplary embodiment of the present disclosure.

FIG. 1B illustrates a block diagram of an exemplary transceiver that may be implemented as part of the communications system according to an exemplary embodiment of the present disclosure. A transceiver 100 includes a transmitter 102 and a receiver 104. The transmitter 102 separates or parses a sequence of data into multiple segments. The transmitter 102 encodes the fragments in accordance with a CRC encoding scheme and/or a Forward Error Correction (FEC) encoding scheme to produce multiple codeblocks in a parallel manner. The transmitter 102 combines the multiple codeblocks to form a data packet for transmission. The receiver 104 separates or parses the data packet into multiple received codeblocks. The receiver 104 decodes each of the received codeblocks in accordance with the CRC encoding scheme and/or the FEC encoding scheme to provide multiple recovered sequences of data. The receiver 104 combines the multiple recovered sequences of data to form a recovered packet. The transceiver 100 may represent an exemplary embodiment of the first transceiver 190 and/or the second transceiver 192.

As shown in FIG. 1B, a higher layer 108 provides a sequence of data 110 to a packet generation block 112. The higher layer 108 and a higher layer 182, that is to be discussed below, may refer to application layers of the Transmission Control Protocol/Internet Protocol (TCP/IP).

The packet generation block 112 formats the sequence of data 110 in accordance with a communications standard to provide a data packet 114. The communications standard may include Second-Generation Wireless Telephone Technology (2G), Third-Generation Wireless Telephone Technology (3G), Long Term Evolution Frequency-Division Duplexing (LTE FDD), Long Term Evolution Time-Division Duplexing (LTE TDD), and Time Division Synchronous Code Division Multiple Access (TD-SCDMA) and/or any other suitable communications standard that will be apparent to those skilled in the relevant art(s) without departing from the spirit and scope of the present disclosure. Typically, the packet generation block 112 separates the sequence of data 110 into multiple segments appends a header to each of the multiple segments to form multiple data packets. One of these multiple data packets may be provided by the packet generation block 112 as the data packet 114.

A parallel encoding block 116 encodes the data packet 114 in accordance to the CRC encoding scheme and/or the FEC encoding scheme in a parallel manner, as opposed to the conventional serial manner, to provide an encoded data packet 132. The parallel encoding block 116 includes a codeblock segmentation block 118, CRC encoders 122.1 through 122.$n$, Forward Error Correction (FEC) encoders 126.1 through 126.$n$, and a codeblock concatenation block 130.

The codeblock segmentation block 118 separates or parses the data packet 114 into segmented data blocks 120.1 through 120.n. Typically, the segmented data blocks 120.1 through 120.n include a substantially similar number of bits, bytes, and/or symbols as each other. The codeblock segmentation block 118 may provide a bit, byte, and/or symbol from the data packet 114 for each of the segmented data blocks 120.1 through 120.n in a round-robin manner. For example, the codeblock segmentation block 118 may provide a first byte, and/or symbol from the data packet 114 as the segmented data block 120.1 and a second byte, and/or symbol from the data packet 114 as the segmented data block 120.2. Alternatively, the codeblock segmentation block 118 may provide more than one bit, byte, and/or symbol from the data packet 114 for each of the segmented data blocks 120.1 through 120.$n$ in the round-robin manner. Typically, the round-robin manner cycles through the segmented data blocks 120.1 through 120.$n$ in order of their index value, however, those skilled in the relevant art(s) will recognize that the round-robin manner may cycle through the segmented data blocks 120.1 through 120.$n$ in any suitable order without departing from the spirit and scope of the present disclosure.

The CRC encoders 122.1 through 122.$n$ encode the segmented data blocks 120.1 through 120.$n$ in accordance with the CRC encoding scheme to provide encoded codeblocks 124.1 through 124.$n$. The CRC encoders 122.1 through 122.$n$ attach one or more check bits to the segmented data blocks 120.1 through 120.$n$. In an embodiment, the one or more check bits are determined by dividing information polynomials that represent the segmented data blocks 120.1 through 120.$n$ by a CRC polynomial C(D) to produce quotient polynomials and remainders. The CRC encoders 122.1 through 122.$n$ appends the remainders as the one or more check bits to the segmented data blocks 120.1 through 120.$n$ to provide the encoded codeblocks 124.1 through 124.$n$.

The following example illustrates an exemplary operation of one of the CRC encoders 122.1 through 122.$n$. However, this example is not limiting, those skilled in the relevant art(s) will recognize that other CRC encoding schemes may be used without departing from the spirit and scope of the present disclosure.

Considering one of the segmented data blocks 120.1 through 120.$n$, having a length M, can be represented though a polynomial:

$$I(D)=i_{M-1}\times D^{M-1}+i_{M-2}\times D^{M-2}\ldots i_0\times D^0 \quad (1)$$

Also considering, a CRC polynomial C(D) of degree N, which can be represented as:

$$C(D)=c_N\times D^N+c_{N-1}\times D^{N-1}\ldots c_0\times D^0, \quad (2)$$

the one or more check bits may be determined by dividing the polynomial $I(D)\times D^N$ by the CRC polynomial C(D) to produce a quotient polynomial Q(D) and a remainder E(D).

The quotient polynomial Q(D) can be represented as:

$$Q(D)=q_{M-1}\times D^{M-1}+q_{M-2}\times D^{M-2}\ldots q_0\times D^0 \quad (3)$$

and the remainder E(D) may be represented one or more bits:

$$E_{N-1}\ E_{N-2}\ E_{N-3},\ldots E_1\ E_0, \quad (4)$$

or the remainder E(D) can be represented as a polynomial:

$$E(D)=(E_{N-1}\times D^{N-1}+E_{N-2}\times D^{N-2}\ldots E_0\times D^0) \quad (5)$$

The remainder E(D) may be appended to the corresponding one of the segmented data blocks 120.1 through 120.$n$ to provide a corresponding encoded codeblock 124.1 through 124.$n$.

The FEC encoders 126.1 through 126.$n$ encode the encoded codeblocks 124.1 through 124.$n$ in accordance with the FEC encoding scheme to provide encoded codeblocks 128.1 through 128.$n$. The FEC encoding scheme may include a block encoding scheme, such as Reed-Solomon decoding, and/or a convolutional encoding scheme, such as turbo encoding, to provide some examples.

The codeblock concatenation block 130 combines the encoded codeblocks 128.1 through 128.$n$ to provide the encoded data packet 132. The codeblock concatenation block 130 may combine the encoded codeblocks 128.1 through 128.$n$ in accordance with the round-robin manner as discussed above. The codeblock concatenation block 130 may combine the encoded codeblocks 128.1 through 128.$n$ in a substantially similar or different manner than that used by the codeblock segmentation block 118 to separate or parse the data packet 114.

The radio frequency (RF) signal generator 140 formats the encoded data packet 132 for transmission onto a wired or wireless communication channel to provide a transmitted communications signal 142. For example, the RF signal generator 140 may encode bits and/or bytes of the encoded data packet 132 into one or more symbols in accordance with a modulation scheme, such as binary phase shift keying (BPSK), quadrature phase shift keying (QPSK) or quadrature amplitude modulating (QAM) to provide some examples. As another example, the RF signal generator 140 may upconvert the encoded data packet 132, or the symbols of the encoded data packet 132, for transmission onto the communication channel 106. The RF signal generator 140 may upconvert the encoded data packet 132 using any suitable single carrier transmission scheme such as code division multiple access (CDMA), frequency division multiple access (FDMA), time division multiple access (TDMA), and/or any other suitable single carrier multiple access scheme that will be apparent by those skilled in the relevant art(s) without departing from the spirit and scope of the present disclosure. Alternatively, the RF signal generator 140 may upconvert the encoded data packet 132 using any suitable multiple carrier transmission scheme such as discrete multi-tone (DMT) modulation, orthogonal frequency division multiplexing (OFDM), coded OFDM (COFDM), and/or any other suitable multiple carrier transmission that will be apparent by those skilled in the relevant art(s) without departing from the spirit and scope of the present disclosure.

The RF signal processing block 150 observes a received communications signal 146 to provide a recovered sequence of data 158. The RF signal processing block 150 may downconvert the received communications signal 146 using the suitable single carrier transmission scheme and/or the suitable multiple carrier transmission scheme. The RF signal processing block 150 may decode one or more symbols of the received communications signal 146 in accordance with the modulation scheme to generate a data packet 158.

A parallel decoding block 160 decodes the data packet 158 in accordance with the CRC encoding scheme and/or the FEC encoding scheme in a parallel, or substantially simultaneous, manner, as opposed to the conventional serial manner, to provide a recovered data packet 176. The parallel decoding block 160 includes a codeblock segmentation block 162, FEC decoders 166.1 through 166.n, and a codeblock concatenation block 174. The codeblock segmentation block 162 separates or parses the recovered sequence of data 158 into recovered segmented data blocks 164.1 through 164.n. Typically, the codeblock segmentation block 162 may separate or parse the recovered sequence of data 158 in a substantially similar manner that is used by the codeblock concatenation block 130 to combine the encoded codeblocks 128.1 through 128.n. For example, the codeblock segmentation block 162 may separate or parse the recovered sequence of data 158 in accordance with the round-robin manner as discussed above.

The FEC decoders 166.1 through 166.n decode the recovered segmented data blocks 164.1 through 164.n in accordance with the FEC encoding scheme to provide decoded codeblocks 168.1 through 168.n.

The CRC decoders 170.1 through 170.n decode the decoded codeblocks 168.1 through 168.n in accordance with the CRC encoding scheme to provide decoded codeblocks 172.1 through 172.n. The codeblock concatenation block 174 combines the decoded codeblocks 172.1 through 172.n to provide the recovered data packet 176. The codeblock concatenation block 174 may concatenate the decoded codeblocks 172.1 through 172.n in accordance with the round-robin manner. The codeblock concatenation block 174 may concatenate the decoded codeblocks 172.1 through 172.n in a substantially similar or different manner than that used by the codeblock segmentation block 118 to separate or parse the data packet 114

Conventional CRC Decoding

Figure 2:
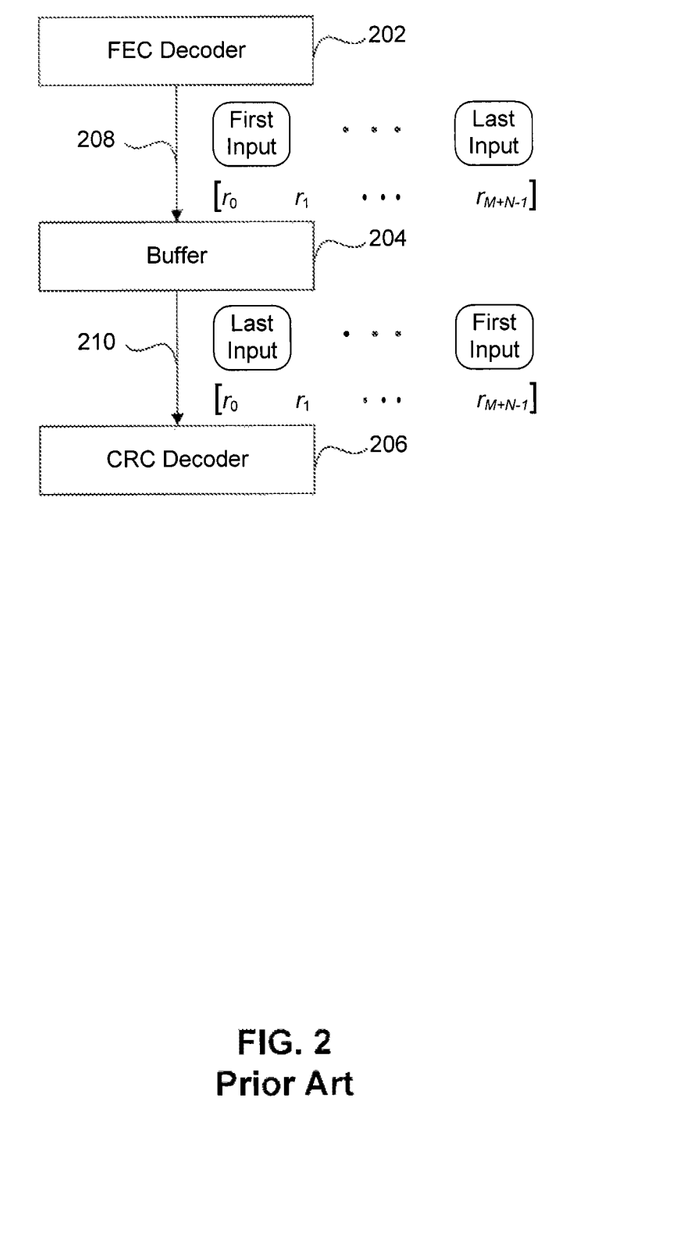
FIG. 2 illustrates a block diagram of a conventional Cyclic Redundancy Check (CRC) decoder.

FIG. 2 illustrates a block diagram of a conventional CRC decoder. A FEC decoder 202, a buffer 204, and a CRC decoder 206 are illustrated. As discussed above, the conventional CRC decoder decodes the data packet starting from a most significant bit, typically an information bit, to the least significant bit, typically a check bit. Conventionally, this decoding involves dividing the data packet, which may be represented as a received polynomial R(D), by the CRC polynomial C(D) used by the conventional transmitter to produce a quotient polynomial Q(D) and a remainder E(D). Conventionally, this division may be referred to as MSB side division since the conventional CRC decoder first divides a most significant or largest term of the received polynomial R(D) by the CRC polynomial C(D) to provide a most significant or largest term of the quotient polynomial Q(D).

For example, consider the following conventional CRC calculation that indicates an error free transmission:

$$\begin{array}{r}D^3+D^2+1\phantom{aaaaaaaaaaaaaaaa}\\D^8+D^7+D^4+D^3+D+1\overline{)\;D^{11}+\phantom{a}+D^9+D^8+\phantom{a}+D^5+\phantom{a}+D^3+D^2+D+1}\\D^{11}+D^{10}+\phantom{a}+D^7+D^6+\phantom{a}+D^4+D^3\phantom{aaaaaaaaa}\\\overline{D^{10}+D^9+D^8+D^7+D^6+D^5+D^4+\phantom{a}+D^2+D+1}\\D^{10}+D^9+\phantom{a}+D^6+D^5+\phantom{a}+D^3+D^2\phantom{aaaaaaaa}\\\overline{D^8+D^7+\phantom{a}+D^4+D^3+\phantom{a}+D+1}\\D^8+D^7+\phantom{a}+D^4+D^3+\phantom{a}+D+1\\\overline{\phantom{aaaaaaaaaaaaa}0\phantom{aaaaaaaaaaaaa}}\end{array}$$

In this example, the polynomial $D^8+D^7+D^4+D^3+D+1$ represents the CRC polynomial C(D), the polynomial $D^3+D^2+1$ represents the quotient polynomial Q(D), the polynomial $D^{11}+D^9+D^8+D^5+D^3+D^2+D+1$ represents a received polynomial R(D), and the remainder E(D) is 0.

As demonstrated by this example, each term of the received polynomial R(D) must be received before the conventional CRC decoder may determine whether an error occurred during transmission when using the MSB side division. For example, the conventional CRC decoder must receive the most significant teen, namely $D^{11}$, before beginning the MSB side division. This may cause the conventional CRC decoder to wait until the most significant term of the received polynomial R(D) is received. Conventionally, the conventional CRC decoder is coupled to a buffer to store the other terms of the received polynomial R(D) until the most significant term of the received polynomial R(D) is received by the conventional CRC decoder.

As shown in FIG. 2, a conventional FEC decoder 202 may decode a sequence of data in accordance with a FEC encoding scheme to provide a decoded sequence of data 208. The conventional FEC decoder 202 typically provides a least significant bit (LSB) of the decoded sequence of data 208 before providing its most significant bit (MSB). As a result, buffering is required before the decoded sequence of data 208 can be CRC decoded.

The conventional buffer 204 stores the decoded sequence of data 208 until receiving the MSB of the decoded sequence of data 208. The conventional buffer 204 reverses ordering of the decoded sequence of data 208 to provide the MSB of the decoded sequence of data 208 before providing its lesser significant bits to provide an aligned sequence of data 210. In other words, the last bit $r_{M+N-1}$ from the decoded sequence of data 208 is provided as the first bit $r_{M+N-1}$ of the aligned sequence of data 210.

The conventional CRC decoder 206 decodes the aligned sequence of data 210 beginning with the most significant term using the MSB side division. The conventional CRC decoder 206 decodes the aligned sequence of data 210, in its entirety, before a determination of whether an error occurred during transmission of the data packet can be made.

Exemplary CRC Decoding System

Figure 3:
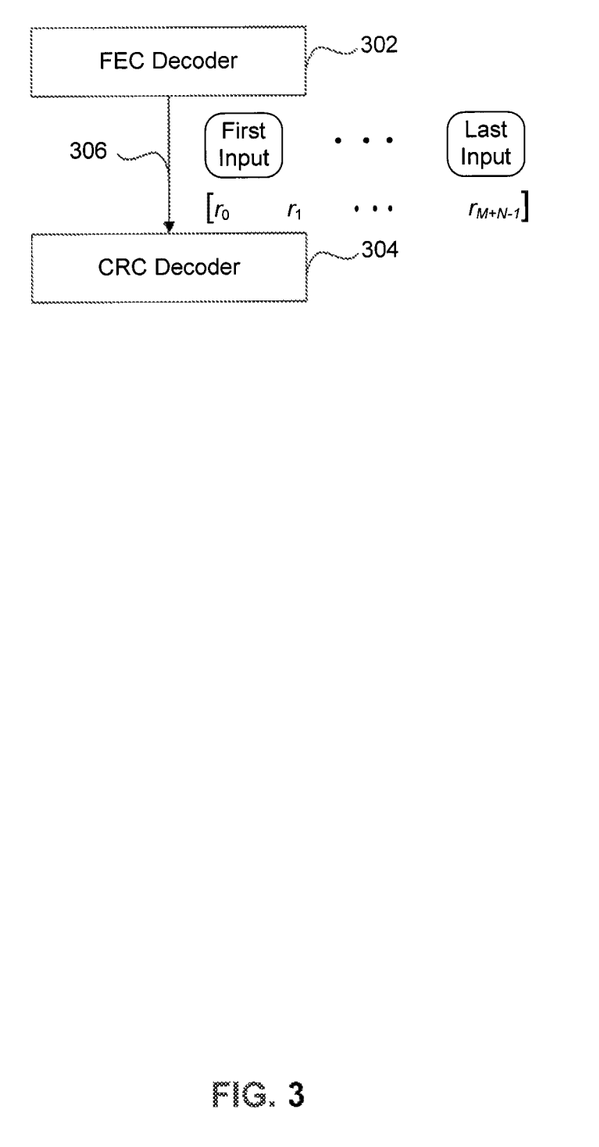
FIG. 3 illustrates a block diagram of a CRC decoder according to an exemplary embodiment of the present disclosure.

FIG. 3 illustrates a block diagram of a CRC decoder system according to an exemplary embodiment of the present disclosure. The CRC decoder system of this disclosure decodes a sequence of data starting from a least significant bit, byte, or symbol, typically a check bit, to a most significant bit, byte, or symbol, typically an information bit, thereby avoiding the latency of the buffering of the data packet that is necessary for the conventional CRC decoder. Specifically, the CRC decoder system of this disclosure operates upon the sequence of data using a least significant bit (LSB) side scheme that is tantamount to dividing the sequence of data, which may be represented as the received polynomial R(D), by the CRC polynomial C(D) to determine whether an error occurred during its transmission. As to be discussed below, the LSB side scheme allows the CRC decoder of this disclosure to terminate decoding once the quotient polynomial Q(D) indicates that the error occurred during transmission of the sequence of data. This advantageously allows the CRC decoder of this disclosure to request re-transmission of the sequence of data, or a portion thereof, once the error has been detected without the need to decode the entire received polynomial R(D).

The LSB side scheme determines coefficients of the quotient polynomial Q(D) through an exclusive disjunction of coefficients of the received polynomial R(D) and previous coefficients of the quotient polynomial Q(D). For example, each coefficient of the quotient polynomial Q(D) may be expressed as:

$$q_p = r_p \oplus \sum_{i=1}^{p-1} q_{p-i} \times C_i, \quad (6)$$

where $q_p$ represents the coefficient of the $p^{th}$ term of the quotient polynomial Q(D), $r_p$ represents the coefficient of the $p^{th}$ term of the received polynomial R(D), and $C_i$ represents the coefficient of the $i^{th}$ term of the CRC polynomial C(D). Once the quotient polynomial is found out, the CRC decoder declares the received codeword is erroneous if the degree of the quotient polynomial is greater than or equal to M. If the degree of Q(D) is strictly less than M then the received codeword is error-free.

For example, assuming the CRC polynomial C(D) can be represented as $D^8+D^7+D^4+D^3+D+1$ and the received polynomial R(D) can be represented as $D^{11}+D^9+D^8+D^5+D^3+D^2+D+1$, then $r_0=1$; $r_1=1$; $r_2=1$; $r_3=1$; $r_4=0$; $r_5=1$; $r_6=0$; $r_7=0$; $r_8=1$; $r_9=1$; $r_{10}=0$; $r_{11}=1$. According to Equation (6), the coefficients of the quotient polynomial Q(D) can be represented $q_p = r_p \oplus q_{p-1} \oplus q_{p-3} \oplus q_{p-4} \oplus q_{p-7} \oplus q_{p-8}$ which provides:

$q_0 = r_0 = 1$ $q_1 = r_1 \oplus q_0 = 1 \oplus 1 = 0$ $q_2 = r_2 \oplus q_1 = 1 \oplus 0 = 1$ $q_3 = r_3 \oplus q_2 \oplus q_0 = 1 \oplus 1 \oplus 1 = 1$ $q_4 = r_4 \oplus q_3 \oplus q_1 \oplus q_0 = 0 \oplus 1 \oplus 0 \oplus 1 = 0$ $q_5 = r_5 \oplus q_4 \oplus q_2 \oplus q_1 = 1 \oplus 0 \oplus 1 \oplus 0 = 0$ $q_6 = r_6 \oplus q_5 \oplus q_3 \oplus q_2 = 0 \oplus 0 \oplus 1 \oplus 1 = 0$ $q_7 = r_7 \oplus q_6 \oplus q_4 \oplus q_3 \oplus q_0 = 0 \oplus 0 \oplus 0 \oplus 1 \oplus 1 = 0$ $q_8 = r_8 \oplus q_7 \oplus q_5 \oplus q_4 \oplus q_1 \oplus q_0 = 1 \oplus 0 \oplus 0 \oplus 0 \oplus 1 \oplus 0 = 0$ $q_9 = r_9 \oplus q_8 \oplus q_6 \oplus q_5 \oplus q_2 \oplus q_1 = 1 \oplus 0 \oplus 0 \oplus 0 \oplus 1 \oplus 0 = 0$ $q_{10} = r_{10} \oplus q_9 \oplus q_7 \oplus q_6 \oplus q_3 \oplus q_2 = 0 \oplus 0 \oplus 0 + 0 \oplus 0 \oplus 1 \oplus 1 = 0$ $q_{11} = r_{11} \oplus q_{10} \oplus q_8 \oplus q_7 \oplus q_4 \oplus q_3 = 1 \oplus 0 \oplus 0 \oplus 0 \oplus 0 \oplus 1 = 0$ Accordingly, the quotient polynomial Q(D) may be represented as $D^3+D^2+D$ in this example. Assuming that the first coefficients, namely $D^{11}$ through $D^8$ of the received polynomial R(D) represent information bits, bytes, and/or symbols, and the next eight coefficients, namely $D^7$ through $D^0$ represent check bits, any non-zero value after the first four coefficients of the quotient polynomial Q(D), i.e, q4 to q11, indicates that the error occurred during transmission of the data packet. In this case, the coefficients from q4 to q11 are zeros which indicates the received packet is error-fee.

As another example, assuming the received polynomial R(D) can be represented as $D^{11}+D^8+D^5+D^3+D^2D+1$, then $r_0=1$; $r_1=1$; $r_2=1$; $r_3=1$; $r_4=0$; $r_5=1$; $r_6=0$; $r_7=0$; $r_8=1$; $r_9=0$; $r_{10}=0$; $r_{11}=1$. According to Equation (6) and using the same CRC polynomial C(D) as the previous example, the coefficients of the quotient polynomial Q(D) can be represented $q_p = r_p \oplus q_{p-1} \oplus q_{p-3} \oplus q_{p-4} \oplus q_{p-7} \oplus q_{p-8}$ which provides:

$q_0 = r_0 = 1$ $q_1 = r_1 \oplus q_0 = 1 \oplus 1 = 0$ $q_2 = r_2 \oplus q_1 = 1 \oplus 0 = 1$ $q_3 = r_3 \oplus q_2 \oplus q_0 = 1 \oplus 1 \oplus 1 = 1$ $q_4 = r_4 \oplus q_3 \oplus q_1 \oplus q_0 = 0 \oplus 1 \oplus 0 \oplus 1 = 0$ $q_5 = r_5 \oplus q_4 \oplus q_2 \oplus q_1 = 1 \oplus 0 \oplus 1 \oplus 0 = 0$ $q_6 = r_6 \oplus q_5 \oplus q_3 \oplus q_2 = 0 \oplus 0 \oplus 1 \oplus 1 = 0$ $q_7 = r_7 \oplus q_6 \oplus q_4 \oplus q_3 \oplus q_0 = 0 \oplus 0 \oplus 0 \oplus 1 \oplus 1 = 0$ $q_8 = r_8 \oplus q_7 \oplus q_5 \oplus q_4 \oplus q_1 \oplus q_0 = 1 \oplus 0 \oplus 0 \oplus 0 \oplus 1 \oplus 0 = 0$ $q_9 = r_9 \oplus q_8 \oplus q_6 \oplus q_5 \oplus q_2 \oplus q_1 = 0 \oplus 0 \oplus 0 \oplus 0 \oplus 1 \oplus 0 = 1$ $q_{10} = r_{10} \oplus q_9 \oplus q_7 \oplus q_6 \oplus q_3 \oplus q_2 = 0 \oplus 1 \oplus 0 \oplus 0 \oplus 1 \oplus 1 = 1$ $q_{11} = r_{11} \oplus q_{10} \oplus q_8 \oplus q_7 \oplus q_4 \oplus q_3 = 1 \oplus 1 \oplus 0 \oplus 0 \oplus 0 \oplus 1 = 2$ Accordingly, the quotient polynomial Q(D) may be represented as $D^{11}+D^{10}+D^9+D^3+D^2+D$ in this example. Assuming that the first coefficients, namely $D^{11}$ through $D^8$ of the received polynomial R(D) represent information bits, bytes, and/or symbols, and the next eight coefficients, namely $D^7$ through $D^0$ represent check bits, the non-zero value after the first four coefficients of the quotient polynomial Q(D), namely the coefficients $q_4$ through $q_{11}$ the quotient polynomial Q(D), indicates that the error occurred during transmission of the data packet. In this situation, the CRC decoder of this disclosure may request re-transmission of the data packet, or a portion thereof, once the error has been detected, namely once coefficient $q_9$ has been determined, without the need to decode the entire received polynomial R(D).

As shown in FIG. 3, the CRC decoder system of this disclosure includes a FEC decoder 302 and a CRC decoder 304. The FEC decoder 302 and the CRC decoder 304 may represent an exemplary embodiment of one of the FEC decoders 166.1 through 166.n and its corresponding CRC decoder 170.1 through 170.n.

The FEC decoder 302 may decode a sequence of data in accordance with a FEC encoding scheme to provide a decoded sequence of data 306. The FEC decoder 302 typically provides a least significant bit (LSB) of the decoded sequence of data 306 before providing its most significant bit (MSB). As a result, buffering is not required before the decoded sequence of data 306 can be CRC decoded.

The CRC decoder 304 decodes the decoded sequence of data 306 beginning with the least significant term using the LSB side division to determine whether an error occurred during transmission of the sequence of data.

Exemplary CRC Decoder

Figure 6:
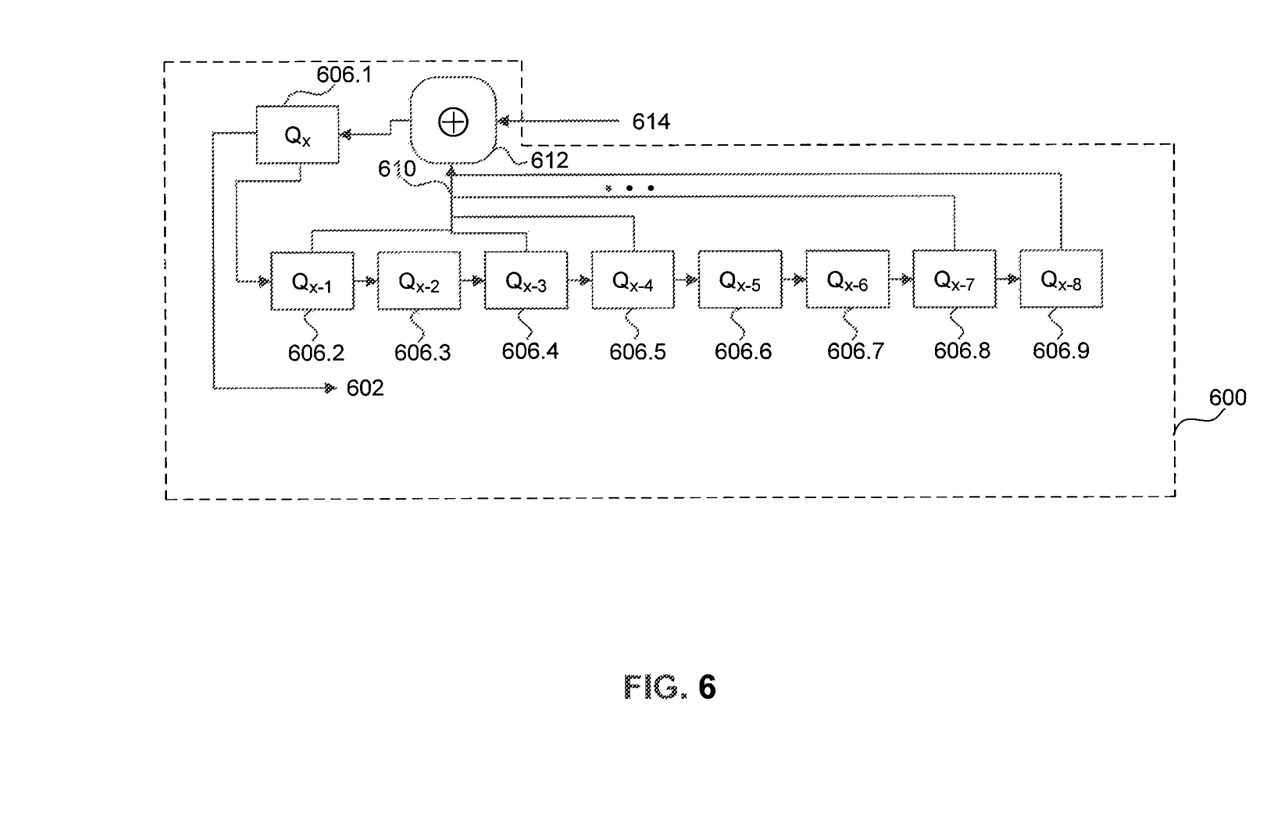
FIG. 6 illustrates an exemplary implementation of a CRC decoder according to an exemplary embodiment of the present disclosure.

FIG. 6 illustrates an exemplary implementation of a CRC decoder according to an exemplary embodiment of the present disclosure. A CRC decoder 600 implements a LSB side scheme to decode a sequence of data 614. As discussed above, the LSB side scheme determines coefficients of the quotient polynomial Q(D) through an exclusive disjunction of coefficients of the received polynomial R(D) and previous coefficients of the quotient polynomial Q(D). The CRC decoder includes shift registers 606.1 through 606.9 and an exclusive or (XOR) module 612. However, this example is not limiting, those skilled in the relevant art(s) will recognize that more or less shift registers may be used without departing from the spirit and scope of the present disclosure. Typically, the number of shift registers used is determined by combining the number of information bits and the number of check bits in the received polynomial R(D).

The XOR module 612 receives one bit, byte, and/or symbol of the sequence of data 614. The XOR module 612 performs an XOR operation between this one bit, byte, and/or symbol of the sequence of data 614 and one or more previous coefficients of the quotient polynomial Q(D) to determine a current coefficient of the quotient polynomial Q(D) in accordance with the LSB side scheme as outlined in Equation (6). For example, to determine the first coefficient of the quotient polynomial Q(D), the XOR module 612 performs the XOR operation upon a first bit, byte, and/or symbol of the sequence of data 614 and zero since there are no previous coefficients of the quotient polynomial Q(D). As another example, to determine the second coefficient of the quotient polynomial Q(D), the XOR module 612 performs the XOR operation upon a second bit, byte, and/or symbol of the sequence of data 614 and the first coefficient of the quotient polynomial Q(D). As a further example, the XOR module 612 performs the XOR operation upon a third bit, byte, and/or symbol of the sequence of data 614 and the first and the second coefficients of the quotient polynomial Q(D).

The shift registers 606.1 through 606.9 shift the coefficients of the quotient polynomial Q(D) to provide the previous coefficients of the quotient polynomial Q(D) to the XOR module 612.

As discussed above for FIG. 1B, the codeblock concatenation block 174 combines the decoded codeblocks 172.1 through 172.n to provide the recovered data packet 176. The codeblock concatenation block 174 may combine the decoded codeblocks 172.1 through 172.n in accordance with the round-robin manner as discussed above. The codeblock concatenation block 174 may combine the decoded codeblocks 172.1 through 172.n in a substantially similar or different manner than that used by the codeblock segmentation block 118 to separate or parse the data packet 114.

The ACK/NACK feedback generation block 178 examines the recovered data packet 176 to determine whether an error occurred during transmission. The ACK/NACK feedback generation block 178 examines the decoded codeblocks 172.1 through 172.n within the recovered data packet 176 to determine whether all of the decoded codeblocks 172.1 through 172.n have been received without errors. In this situation, the ACK/NACK feedback generation block 178 provides an ACK feedback to its corresponding transmitter for transmission to the transceiver that provided the transmitted communications signal 142. The ACK feedback indicates that the recovered data packet 176 does not contain errors and retransmission is not required. Otherwise, the ACK/NACK feedback generation block 178 provides a NACK feedback indicating that the recovered data packet 176 contains errors and retransmission is required. In this situation, the NACK feedback may indicate retransmission of all of the codeblocks of the data packet, or retransmission of only those codeblocks that contain errors. The ACK/NACK feedback generation block 178 passes the recovered data packet 176 onto the higher layers 182 as an errorless data packet 180 when the recovered data packet 176 does not contain errors.

Retransmission of Data When Errors Present

A conventional decoder, such as the CRC decoder 206 to provide an example, decodes a data packet, in its entirety, starting from a most significant bit, typically an information bit, to a least significant bit, typically a check bit. This decoding involves dividing the data packet, which may be represented as the received polynomial R(D), by the CRC polynomial C(D) to produce a quotient polynomial Q(D) and a remainder E(D). The conventional decoder examines the remainder E(D) to determine whether the error occurred during transmission of the data packet. When the remainder E(D) is zero then no error occurred during transmission of the data packet. Otherwise, some error occurred during transmission of the data packet. In this situation, the conventional decoder may request retransmission of the data packet, in its entirety, from a conventional transmitter. In some situations, the data packet may include multiple codeblocks.

However, a decoder of the present disclosure decodes the packet on a codeblock by codeblock basis. In this situation, this decoder passes those codeblocks onto higher layers, such as the ACK/NACK feedback generation block 178 and/or the higher layers 182 to provide some examples, which have no error. The decoder then substitutes those codeblocks that are error-free with dummy codeblocks and requests retransmission of those codeblocks that have errors. The decoder then adjusts the CRC polynomial C(D) to accommodate for the dummy codeblocks and continues to decode and to substitute until all of the codeblocks are error-free.

Figure 4:
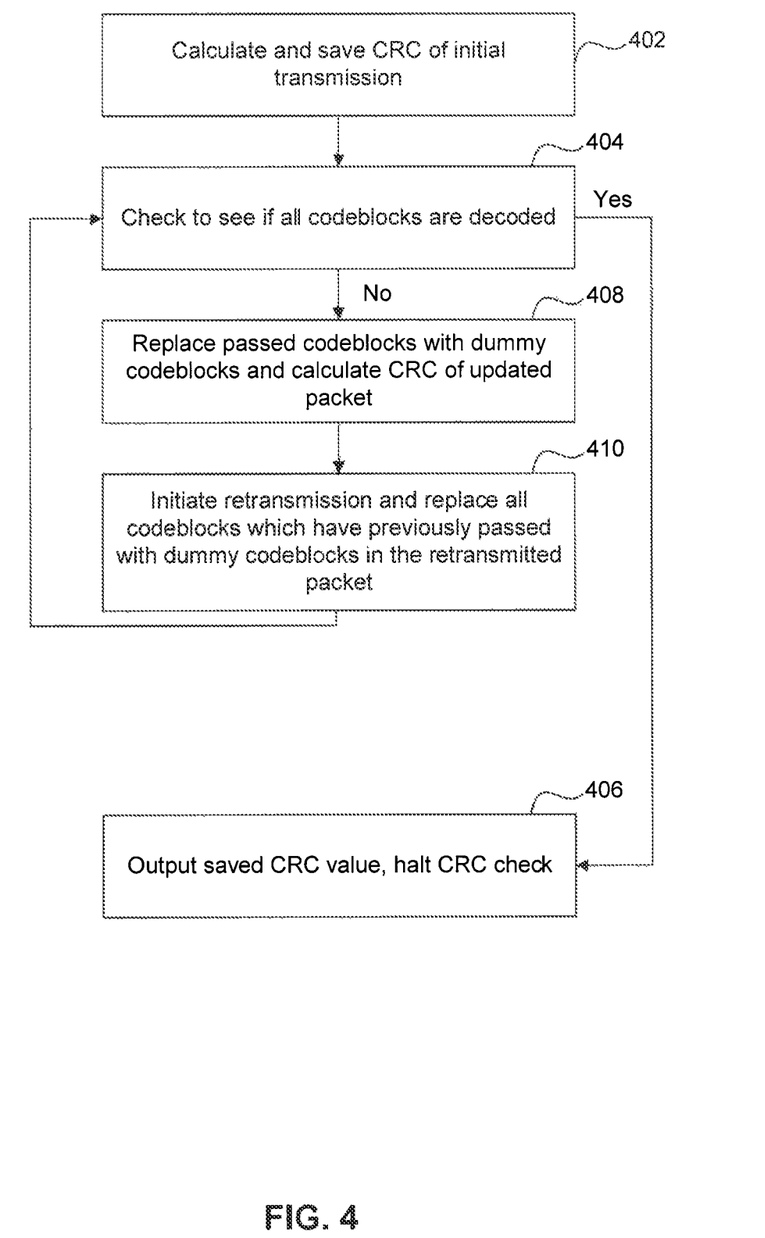
FIG. 4 is a flowchart of exemplary operational steps for retransmission of codeblocks that contain errors according to an exemplary embodiment of the present disclosure.
Figure 5:
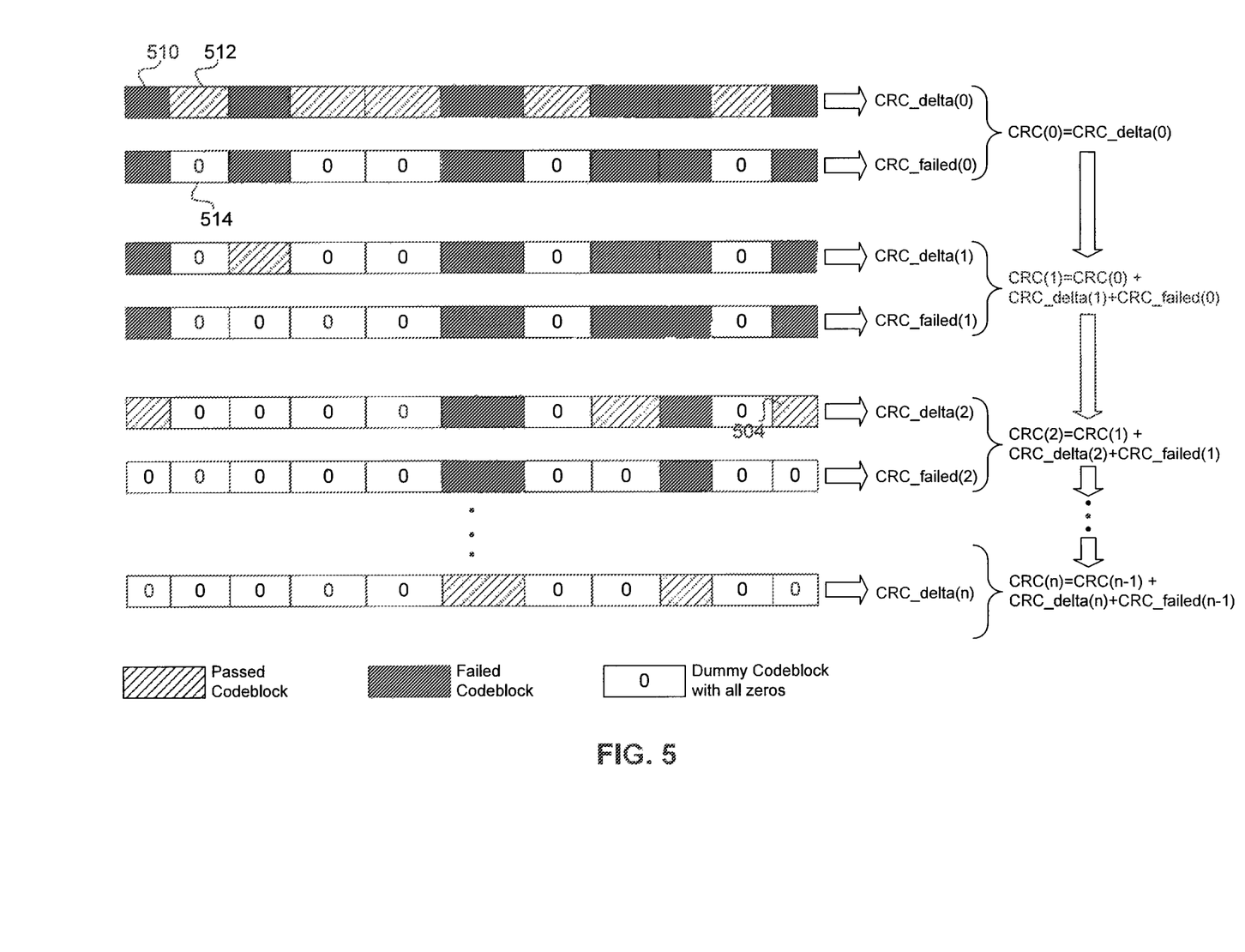
FIG. 5 illustrates a process of an incremental calculation of a CRC value of a sequence of data according to an exemplary embodiment of the present disclosure.

FIG. 4 is a flowchart of exemplary operational steps for retransmission of codeblocks that contain errors according to an exemplary embodiment of the present disclosure. The disclosure is not limited to this operational description. Rather, it will be apparent to persons skilled in the relevant art(s) from the teachings herein that other operational control flows are within the scope and spirit of the present disclosure. The steps of FIG. 4 are described in detail below in conjunction with the packet decoding process illustrated in FIG. 5. FIG. 5 illustrates a process of an incremental calculation of a CRC value of a sequence of data according to an exemplary embodiment of the present disclosure.

At step 402, the operational control flow calculates an initial CRC, denoted as CRC(0) in FIG. 5, for a received data packet.

At step 404, the operational control flow decodes one or more codeblocks of the received data packet using a CRC polynomial C(D). The decoding of the one or more codeblocks may indicate whether the one or more codeblocks have been received without errors. If all of the one or more codeblocks have been received without errors, denoted as error-free codeblocks 512 in FIG. 5, then the received data packet has been received without errors. In this situation, the operational control flow proceeds to step 406 which halts the CRC calculation and retransmission. Otherwise, those codeblocks that include errors, denoted as error codeblocks 510 in FIG. 5, need to be re-transmitted. In this situation, operational control flow proceeds to step 408.

At step 408, the operational control flow replaces those codeblocks without errors with dummy codeblocks, denoted as dummy codeblocks 514 in FIG. 5. Typically, the dummy codeblocks represents codeblocks containing all zeros; however, any other suitable value may be used without departing from the spirit and scope of the present disclosure. The operational control flow calculates a first CRC, denoted as CRC_delta in FIG. 5, and a second CRC, denoted as CRC_failed in FIG. 5, that represents a CRC of the current transmission's received data packet with the all passed codeblocks. The operational control flow calculates a new CRC that is to be used in step 404. As shown in FIG. 5, this new CRC is generally represented as:

$$CRC(n)=CRC(n-1)+CRC\_delta(n)+CRC\_failed(n-1), \quad (7)$$

where CRC(n) represents the new total CRC for the current transmission including all the codeblocks, both passed as well as failed, CRC(n−1) represents a previous transmission's total CRC, CRC_delta(n) represents the first CRC, and CRC_failed(n−1) represents the second CRC for a previous transmission.

At step 410, the operational control flow receives another received data packet. This other received data packet represents a re-transmission of those codeblocks with error and those codeblocks that have been received error-free have been replaced by the dummy codeblocks. The operational control flow reverts back to step 404.

CONCLUSION

It is to be appreciated that the Detailed Description section, and not the Abstract section, is intended to be used to interpret the claims. The Abstract section may set forth one or more, but not all exemplary embodiments, of the present disclosure and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the disclosure. Thus, the present disclosure should not be limited by any of the above-described exemplary embodiments, but should be defined only in accordance with the following claims and their equivalents.

What is claimed is:

1. An apparatus, comprising:
a codeblock segmentation block configured to parse a recovered sequence of data into a plurality of segmented data blocks;
a plurality of Forward Error Correction (FEC) decoders configured to decode, in a parallel manner, the plurality of segmented data blocks in accordance with a FEC encoding scheme to provide a first plurality of decoded codeblocks; and
a plurality of Cyclical Redundancy Check (CRC) decoders, each of the CRC decoders being coupled to a corresponding one of the plurality of FEC decoders, and configured to decode, in the parallel manner, the first plurality of decoded codeblocks in accordance with a CRC encoding scheme to provide a second plurality of decoded codeblocks.

2. The apparatus of claim 1, wherein the codeblock segmentation block is further configured to parse the recovered sequence of data in accordance with a round-robin manner.

3. The apparatus of claim 1, wherein the FEC encoding scheme comprises at least one selected from a group consisting of:
a block encoding scheme; and
a convolutional encoding scheme.

4. The apparatus of claim 1, wherein each of the plurality of CRC decoders is configured to decode a corresponding codeblock in the first plurality of decoded codeblocks using a least significant bit (LSB) side scheme.

5. The apparatus of claim 4, wherein the LSB side scheme is configured to determine coefficients of a quotient polynomial Q(D) of the CRC encoding scheme for a corresponding first plurality of decoded codeblocks through an exclusive disjunction of coefficients of a received polynomial R(D) that represent a corresponding second plurality of decoded codeblocks and previous coefficients of the quotient polynomial Q(D).

6. The apparatus of claim 4, wherein the LSB side scheme is configured to decode a corresponding first plurality of decoded codeblocks beginning with a least significant term from among the corresponding first plurality of decoded codeblocks to determine whether an error occurred during transmission of the recovered sequence of data.

7. A method for decoding a first data packet that is received with an error, the first data packet being characterized as having a plurality of data blocks, the method comprising:
decoding each of the plurality of data blocks, in parallel, in accordance with a first Cyclical Redundancy Check (CRC) of a CRC encoding scheme to determine a first set of data blocks from among the plurality of data blocks that have been received with the error;
substituting a second set of data blocks from among the plurality of data blocks that have been received without the error with dummy codeblocks;

receiving a second data packet that includes the first set of data blocks and the dummy codeblocks; and calculating a second CRC for the second data packet.

8. The method of claim 7, wherein the dummy codeblocks represent codeblocks containing all zeros.

9. The apparatus of claim 1, wherein a first CRC decoder in the plurality of CRC decoders is configured to:

decode a first segmented data block in the plurality of segmented data blocks starting from a least significant bit and ending with a most significant bit to determine whether an error occurred during transmission of the first segmented data block.

10. The apparatus of claim 9, wherein the first CRC decoder is further configured to:

initiate a termination of decoding the plurality of segmented data blocks in response to determining that the error occurred during transmission of the first segmented data block.

11. The apparatus of claim 1, further comprising:

a codeblock concatenation block coupled to respective outputs of the plurality of CRC decoders, wherein the codeblock concatenation block is configured to:

combine the second plurality of decoded codeblocks to provide a recovered data packet; and an acknowledgement feedback generation block configured to:

examine the recovered data packet to determine whether an error occurred during transmission, generate feedback indicating that the recovered data packet does not contain the error in response to determining that the error did not occur during transmission of the recovered data packet, and generate feedback indicating that the recovered data packet contains the error in response to determining that the error occurred during transmission of the recovered data packet.

12. The apparatus of claim 11, wherein the acknowledgement feedback generation block is further configured to:

in response to determining that the error occurred during transmission of the recovered data packet:

initiate a replacement of a first portion of the recovered data packet that contains no errors with one or more dummy codeblocks, and initiate a re-transmission request of a second portion of the recovered data packet that contains the error.

13. A device, comprising:

a signal processing block configured to:

receive a signal, downconvert the signal, and decode a symbol of the signal to generate a data packet; and a parallel decoding block, wherein the parallel decoding block is configured to:

decode the data packet in a parallel manner, and wherein the parallel decoding block comprises:

a codeblock segmentation block coupled to the signal processing block, wherein the codeblock segmentation block is configured to:

separate the data packet into a plurality of segmented data blocks, a plurality of forward error correction (FEC) decoders coupled to the codeblock segmentation block, wherein the plurality of FEC decoders are configured to:

decode the plurality of segmented data blocks using a FEC decoding scheme, a plurality of CRC decoders coupled to respective outputs of the plurality of FEC decoders, wherein the plurality of CRC decoders are configured to:

decode the plurality of segmented data blocks using a CRC decoding scheme to provide a plurality of decoded codeblocks, and a codeblock concatenation block coupled to respective outputs of the plurality of CRC decoders, wherein the codeblock concatenation block is configured to:

combine the plurality of decoded codeblocks to provide a recovered data packet.

14. The device of claim 13, wherein a first CRC decoder in the plurality of CRC decoders is configured to:

decode a first segmented data block in the plurality of segmented data blocks starting from a least significant bit and ending with a most significant bit to determine whether an error occurred during transmission of the first segmented data block.

15. The device of claim 14, wherein the first CRC decoder is further configured to:

initiate a termination of decoding the plurality of segmented data blocks in response to determining that the error occurred during transmission of the first segmented data block.

16. The device of claim 13, further comprising:

an acknowledgement feedback generation block configured to:

examine the recovered data packet to determine whether an error occurred during transmission, generate feedback indicating that the recovered data packet does not contain the error in response to determining that the error did not occur during transmission of the data packet, and generate feedback indicating that the recovered data packet contains the error in response to determining that the error occurred during transmission of the data packet.

17. The device of claim 16, wherein the acknowledgement feedback generation block is further configured to:

initiate a re-transmission request of the data packet or a portion of the data packet in response to determining that the error occurred during transmission of the data packet.

18. The device of claim 16, wherein the acknowledgement feedback generation block is further configured to:

in response to determining that the error occurred during transmission of the data packet:

initiate a replacement of a first portion of the data packet that contains no errors with one or more dummy codeblocks, and initiate a re-transmission request of a second portion of the data packet that contains the error.

19. The method of claim 7, further comprising:

decoding the first set of data blocks starting from a least significant bit and ending with a most significant bit to determine whether the error occurred during transmission of the first set of data blocks.

20. The method of claim 7, further comprising:

initiating a termination of decoding the plurality of data blocks in response to determining that the error occurred during transmission of the first set of data blocks.

* * * * *

UNITED STATES PATENT AND TRADEMARK OFFICE
CERTIFICATE OF CORRECTION

PATENT NO.         : 8,856,609 B2                                        Page 1 of 1
APPLICATION NO.    : 13/434552
DATED              : October 7, 2014
INVENTOR(S)        : Vummintala et al.

It is certified that error appears in the above-identified patent and that said Letters Patent is hereby corrected as shown below:

In the claims

Column 13, line 62, Claim 13 replace "forward error correction" with --Forward Error Correction--.

Column 14, line 3, Claim 13 replace "of CRC" with --of Cyclical Redundancy Check (CRC)--.

Signed and Sealed this
Third Day of March, 2015

Michelle K. Lee
*Deputy Director of the United States Patent and Trademark Office*